United States Patent [19]
Sasaki

[11] Patent Number: 5,661,438
[45] Date of Patent: Aug. 26, 1997

[54] IMPEDANCE MATCHING CIRCUIT

[75] Inventor: Yutaka Sasaki, Tokyo, Japan

[73] Assignee: NEC Corporation, Tokyo, Japan

[21] Appl. No.: 563,965

[22] Filed: Nov. 29, 1995

[30] Foreign Application Priority Data

Nov. 30, 1994 [JP] Japan ................ 6-297274

[51] Int. Cl.⁶ ............................ H03F 3/191
[52] U.S. Cl. ............................ 330/284; 330/306
[58] Field of Search ................ 330/164, 284, 330/302, 306; 333/17.3, 32

[56] References Cited

U.S. PATENT DOCUMENTS

| | | | |
|---|---|---|---|
| 3,585,519 | 6/1971 | Burgess | 330/167 X |
| 3,587,017 | 6/1971 | Kurusu | 325/362 |
| 3,617,915 | 11/1971 | Amemiya et al. | 330/27 |
| 4,090,150 | 5/1978 | Vachenauer | 330/302 |
| 4,673,886 | 6/1987 | Bickley et al. | 330/284 X |
| 5,117,203 | 5/1992 | Tennyson | 330/294 |
| 5,276,912 | 1/1994 | Siwiak et al. | 330/284 X |
| 5,434,540 | 7/1995 | Yamamoto et al. | 330/306 X |

FOREIGN PATENT DOCUMENTS

| | | |
|---|---|---|
| 1766047 | 5/1971 | Germany. |
| 57-135510 | 8/1982 | Japan. |
| 62-7207 | 1/1987 | Japan. |
| 2-46011 | 2/1990 | Japan. |

*Primary Examiner*—James B. Mullins
*Attorney, Agent, or Firm*—Sughrue, Mion, Zinn, Macpeak & Seas

[57] ABSTRACT

In a high frequency amplifying circuit, an impedance matching circuit has an impedance matching inductance, and a switching diode connected in parallel with the inductance. The diode is selectively opened or closed in accordance with the input level, thereby changing an impedance matching condition. When the input level is low, an amplified output is produced by impedance matching which is implemented by the inductance itself. When the input level increases up to a level nearly causing saturation to occur, the diode is opened and rendered conductive with the result that the impedance matching characteristic changes. As a result, a phase characteristic is prevented from being deteriorated by a changed in input level.

8 Claims, 7 Drawing Sheets

IMPEDANCE MATCHING CIRCUIT

BACKGROUND OF THE INVENTION

The present invention relates to an impedance matching circuit for a high frequency amplifying circuit and, more particularly, to an impedance matching circuit capable of preventing a phase characteristic from being deteriorated by a change in input level.

In a conventional high frequency amplifying circuit with an impedance matching circuit, an increase in input level causes an output level to be saturated. As a result, the phase characteristic of a signal available with the amplifying circuit is noticeably deteriorated, compared to a condition wherein the input level is low. When the amplifying circuit deals with a QPSK (Quadrature Phase Shift Keying) or similar modulated signal, its phase characteristic has influence on the channel quality. Hence, the circuit is required to cause a minimum of deterioration in the phase characteristic of a signal. Moreover, when the phase characteristic of a signal undergoes an extreme change, the circuit is apt to perform an operation other than the expected linear operation, e.g., parametric oscillation.

SUMMARY OF THE INVENTION

It is, therefore, an object of the present invention to provide an impedance matching circuit for a high frequency amplifying circuit which is capable of preventing a phase characteristic from being deteriorated by a change in input level.

An impedance matching circuit of the present invention has an inductor cascaded to the collector of an amplifying transistor, and a diode connected in parallel with the inductor.

In a preferred embodiment, the diode is rendered conductive at a voltage slightly lower than a peak voltage to appear between the opposite ends of the inductor when the collector current of the amplifying transistor is saturated due to a signal having a great amplitude and input to the input circuit of the amplifying transistor.

The inductor may constitute an arm of a π matching circuit.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 4:
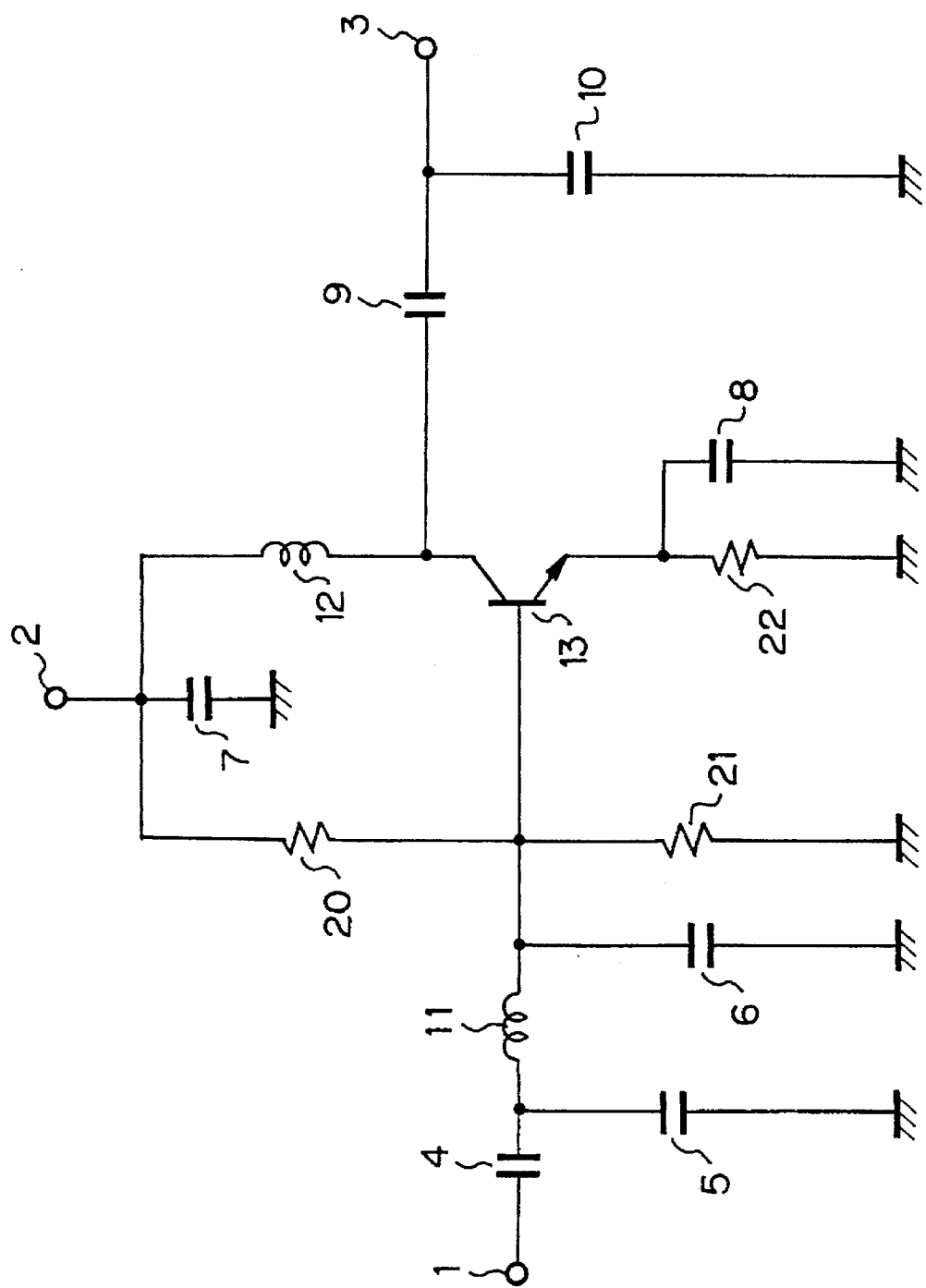
FIG. 4 is a circuit diagram showing a conventional transistor amplifying circuit including an impedance matching circuit.

To better understand the present invention, a brief reference will be made to a conventional transistor amplifying circuit including an impedance matching circuit, shown in FIG. 4. As shown, the amplifying circuit has an input terminal 1, a power source terminal 2, an output terminal 3, a coupling capacitor 4, capacitors 5 and 6 for matching an input impedance, an inductor 11 for matching the input impedance, a transistor 13, bias resistors 20 and 21, an emitter resistor 22, a power source bypass capacitor 7, an emitter bypass capacitor 8, an inductor 12 for matching an output impedance, and capacitors 9 and 10 for matching the output impedance. The capacitors 5 and 6 and inductor 11 constitute an input impedance matching circuit for matching an impedance connected to the input terminal 1 and the input impedance of the transistor 13. Likewise, the capacitors 9 and 10 and inductor 12 constitute an output impedance matching circuit for matching an impedance connected to the output terminal 3 and the output impedance of the transistor 13.

Figure 5:
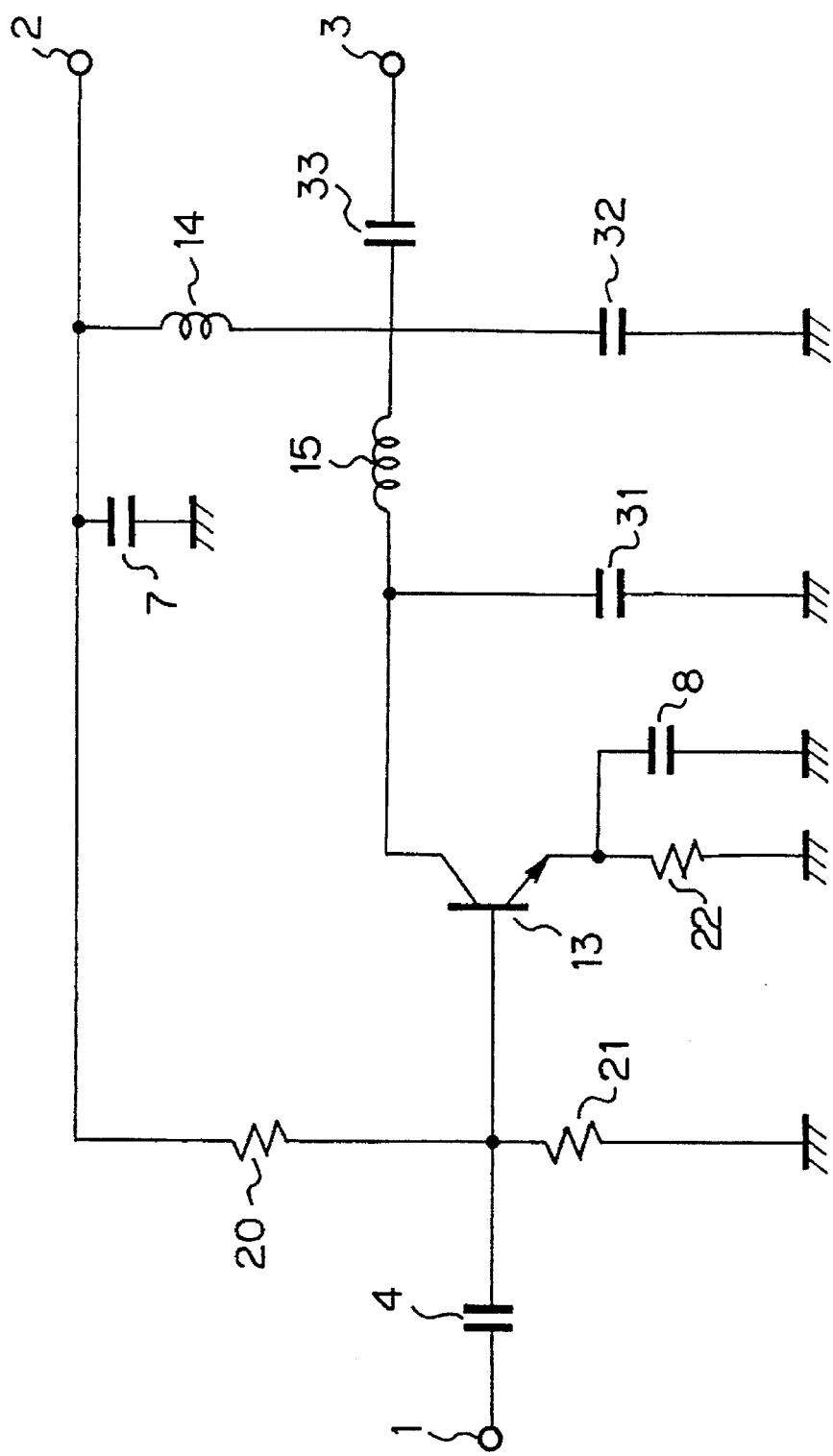
FIG. 5 is a circuit diagram showing another conventional transistor amplifying circuit including an impedance matching circuit.

FIG. 5 shows another conventional transistor amplifying circuit which is implemented by a so-called π matching circuit. As shown, the amplifying circuit has inductors 14 and 15 and capacitors 31, 32 and 33. In FIG. 5, the same constituents as the constituents shown in FIG. 4 are designated by the same reference numerals.

The problem with the above conventional amplifying circuits is that when the input level increases, the output level is saturated, as discussed earlier. As a result, the phase characteristic of a signal available with the circuitry is noticeably deteriorated, compared to a condition wherein the input level is low.

Figure 1:
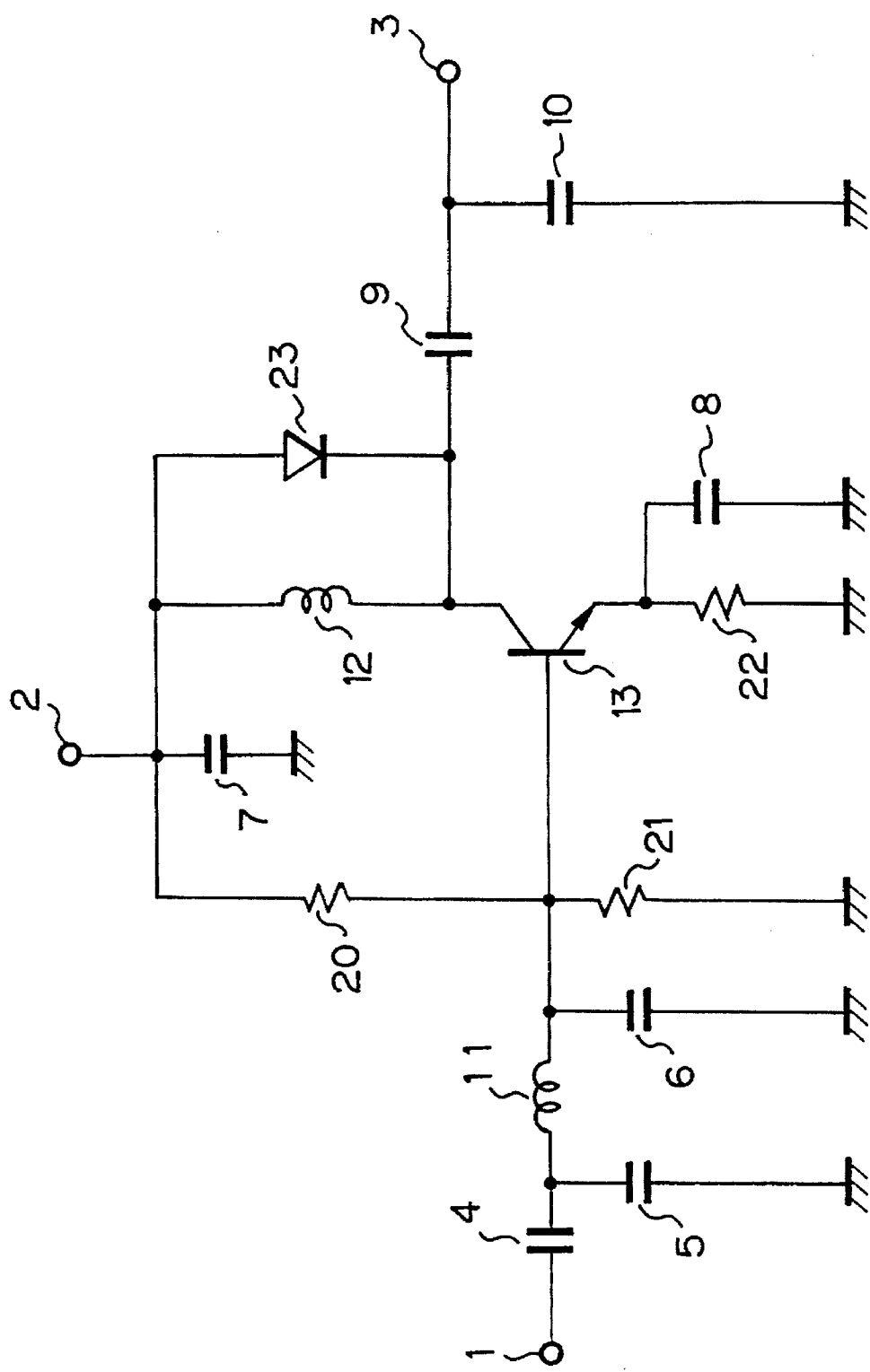
FIG. 1 is a circuit diagram showing a transistor amplifying circuit including an impedance matching circuit embodying the present invention.
Figure 2:
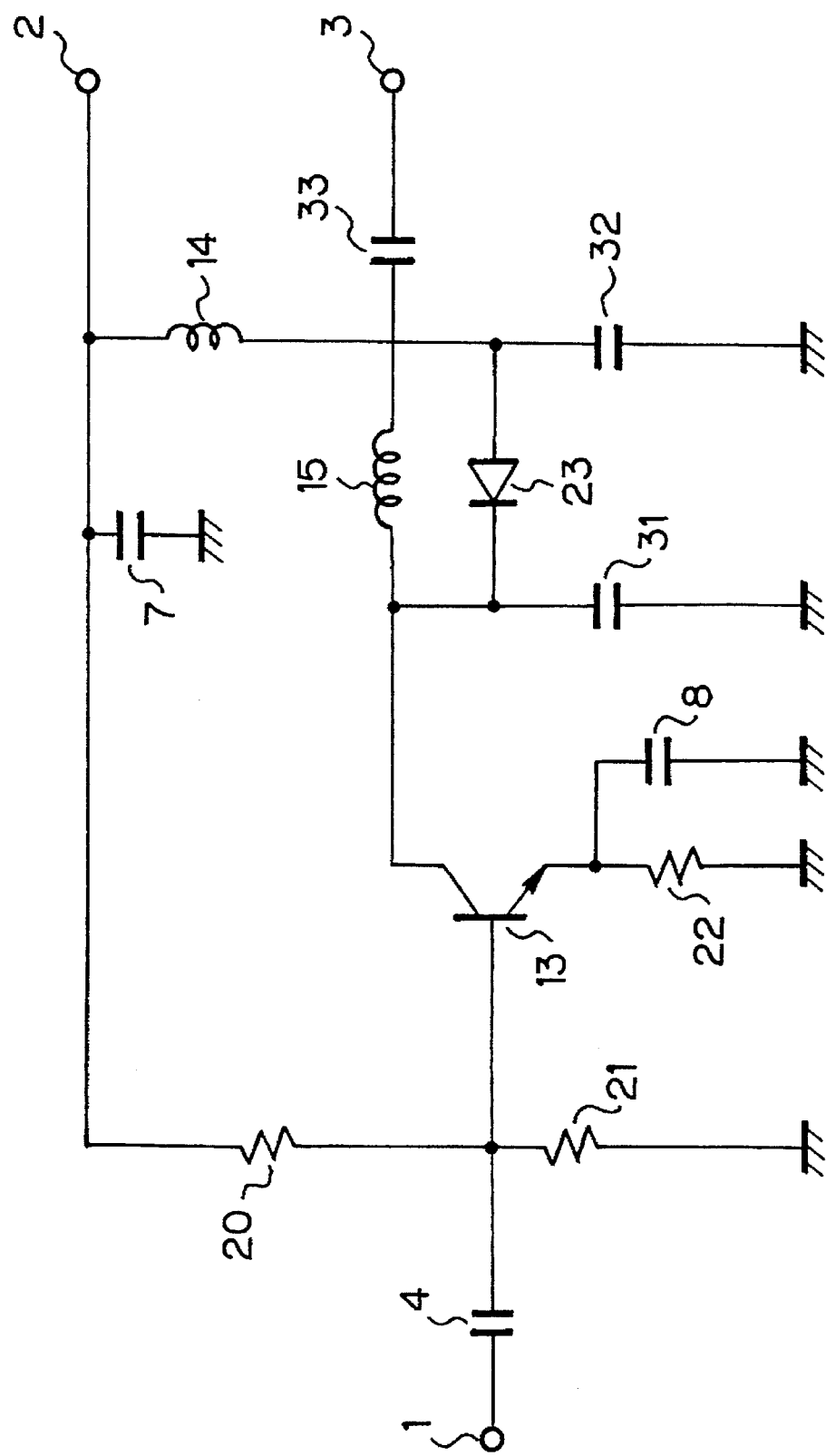
FIG. 2 is a circuit diagram showing a transistor amplifying circuit including an alternative embodiment of the present invention.
Figure 3:
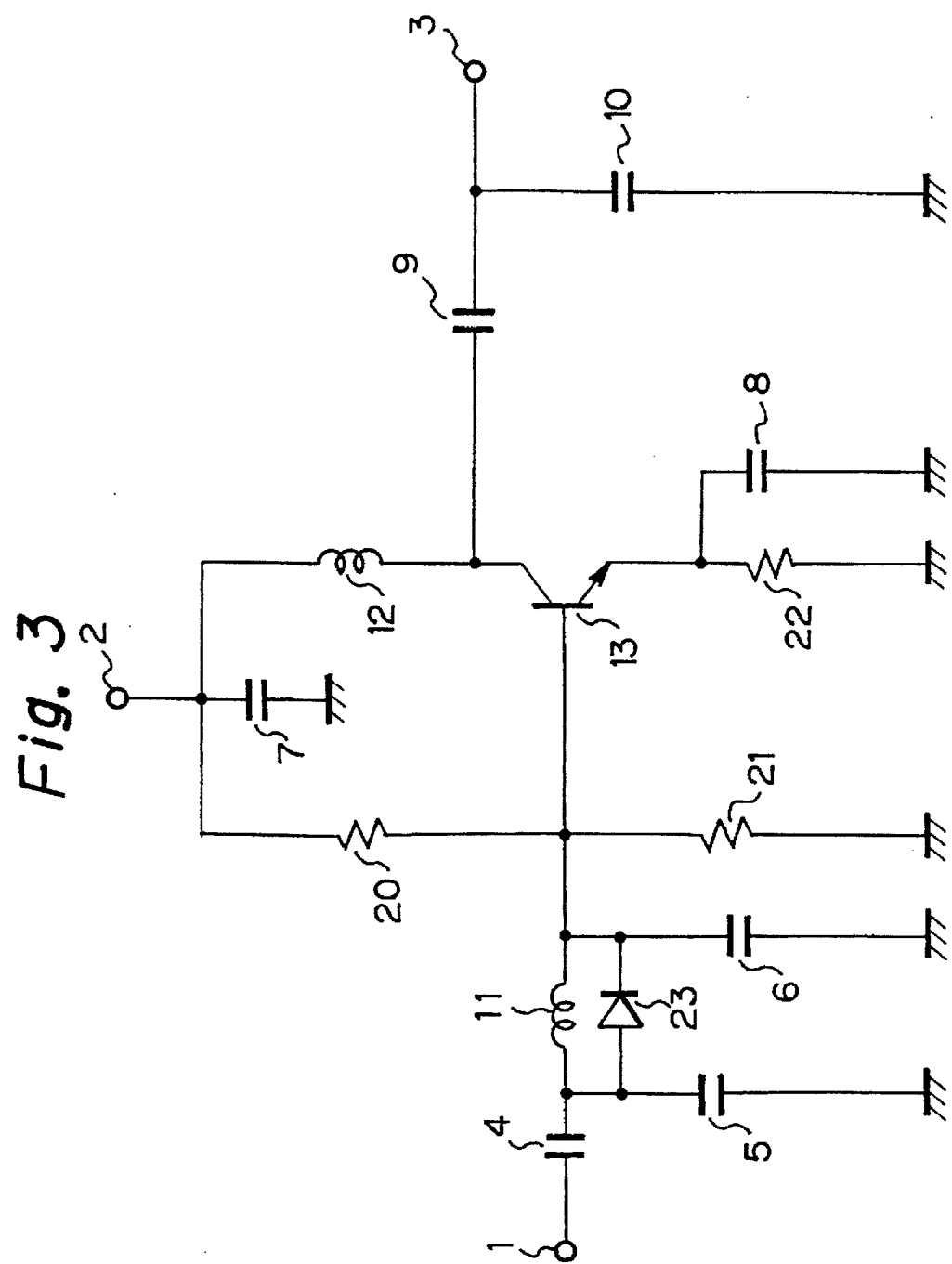
FIG. 3 is a circuit diagram showing a transistor amplifying circuit including another alternative embodiment of the present invention.

Preferred embodiments of the impedance matching circuit in accordance with the present invention will be described with reference to FIGS. 1-3. In FIGS. 1-3, the same constituents as the constituents shown in FIGS. 4 and 5 are designated by the same reference numerals.

Referring to FIG. 1, a transistor amplifying circuit embodying the present invention includes an output impedance matching circuit in which an inductor 12 is cascaded to an amplifying transistor 13. The illustrative embodiment is characterized in that a diode 23 is connected in parallel with the inductor 12. When an input signal having a great amplitude is applied to the input stage of the circuit terminating at the transistor 13, the collector current of the transistor 13 saturated. The diode 23 is rendered conductive at a voltage slightly lower than a peak voltage which appears between the opposite ends of the inductor 12 on the saturation of the collector current.

Specifically, the amplifying circuit has an input terminal 1, a power source terminal 2, an output terminal 3, a coupling capacitor 4, capacitors 5 and 6 for matching an input impedance, an inductor 11 for matching the input impedance, the transistor 13, bias resistors 20 and 21, an emitter resistor 22, a power source bypass capacitor 7, an emitter bypass capacitor 8, the inductor 12 for matching an output impedance, capacitors 9 and 10 for matching the output impedance, and the diode or switching diode 23.

In operation, so long as the level of an input signal is low enough to maintain the transistor 13 unsaturated, the amplifying circuit performs a linear operation. In this condition, the phase of the signal is scarcely changed by the amplifying circuit. When the input level is high, the diode 23 is opened with the result that the inductor 12 is short-circuited. This successfully reduces a change in the phase of the signal. Hence, the phase characteristic of the signal is not noticeably deteriorated even when the output level is saturated.

FIG. 2 shows an alternative embodiment of the present invention. As shown, a transistor amplifying circuit includes an output impedance matching circuit implemented as a so-called $\pi$ matching circuit. As shown, the diode 23 is connected in parallel with an inductor 15. This configuration, like the configuration of FIG. 1, prevents the phase characteristic of the signal from being noticeably changed despite the saturation of the output level.

Another alternative embodiment of the present invention will be described with reference to FIG. 3. As shown, an input impedance matching circuit includes the inductor 11 cascaded to the input stage of the transistor 13. The diode 23 is connected in parallel with the inductor 11. When an input signal having a great amplitude is applied to the input stage of the transistor 13, the collector current of the transistor 13 is saturated. The diode 23 is rendered conductive at a voltage slightly lower than a peak voltage which appears between the opposite ends of the inductor 11 on the saturation of the collector current. The operation of this circuit is identical with the operation of the circuit shown in FIG. 1 except that the inductor 11 for matching the input impedance is substituted for the inductor 12 for matching the output impedance.

In the embodiments shown and described, the diode 23 may be replaced with a serial connection of a plurality of diodes. When the frequency of the input signal to be dealt with by any of the embodiments is high, use may be made of a Schottky type switching diode for the diode 23.

Figure 6:
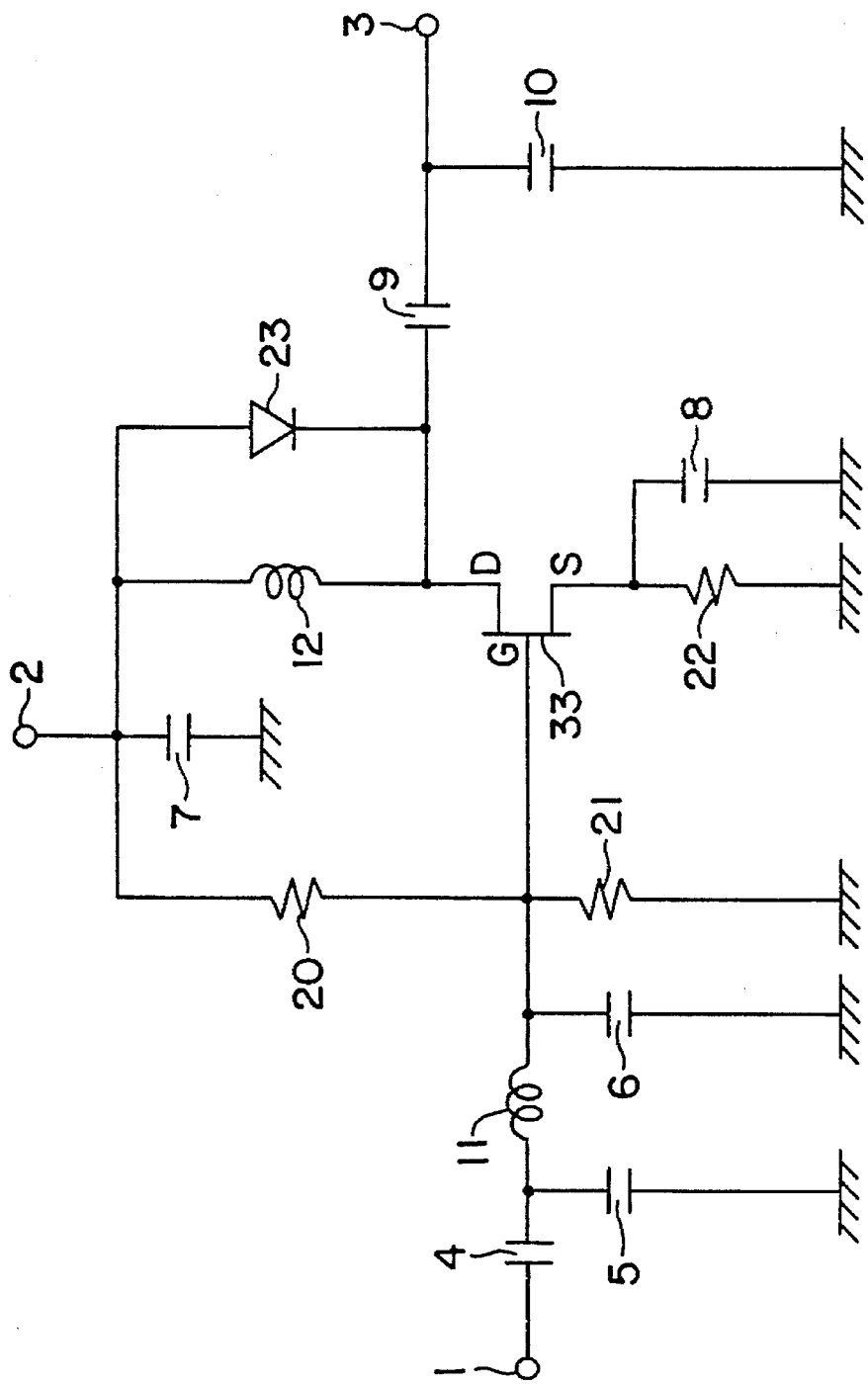
FIG. 6 is a circuit diagram showing a transistor amplifying circuit including yet another alternative embodiment of the present invention based on a field effect transistor.
Figure 7:
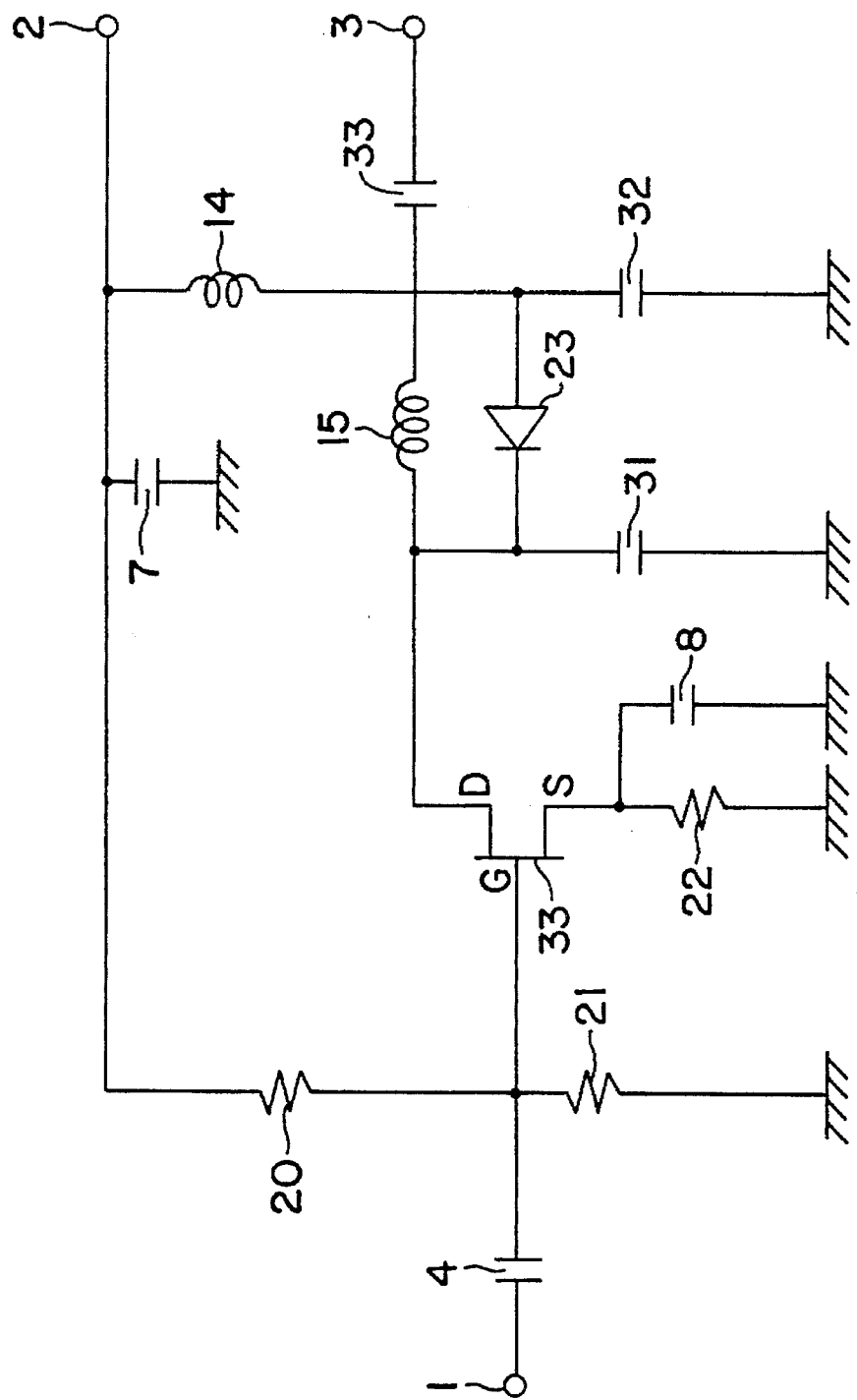
FIG. 7 is a circuit diagram showing a transistor amplifying circuit including still another alternative embodiment of the present invention based on a field effect transistor.

In the embodiments shown in FIGS. 1 and 2, the transistor 13 is shown as being an n-p-n transistor. Alternatively, the transistor 13 may be implemented by an FET (Field Effect Transistor) 33 as shown in FIGS. 6 and 7. With the exception of the FET 33, all of the elements shown in FIGS. 6 and 7 are identical to those included in FIGS. 1 and 2, respectively. These embodiments can achieve the previously stated advantage even when implemented as a mixer circuit.

In summary, the present invention prevents, in a high frequency amplifying circuit, a phase characteristic from being deteriorated by a change in input level. In addition, the present invention realizes a simple impedance matching circuit using a switching diode.

Various modifications will become possible for those skilled in the art after receiving the teachings of the present disclosure without departing from the scope thereof.

What is claimed is:

1. An impedance matching circuit comprising:

an inductor directly connected to an output terminal of an amplifying transistor; and a diode connected in parallel with said inductor;

wherein terminals of said diode are connected directly to terminals of said inductor.

2. A circuit as claimed in claim 1, wherein said diode is rendered conductive at a voltage slightly lower than a peak voltage to appear between opposite ends of said inductor when an output terminal current of said amplifying transistor is saturated due to a signal having a great amplitude being input to an input circuit of said amplifying transistor.

3. A circuit as claimed in claim 1, wherein said amplifying transistor is a n-p-n transistor and said output terminal corresponds to a collector of said n-p-n transistor.

4. A circuit as claimed in claim 3, wherein said diode is rendered conductive at a voltage slightly lower than a peak voltage between opposite ends of said inductor when a collector current of said n-p-n transistor is saturated due to a high amplitude signal being input to an input circuit of said amplifying transistor.

5. A circuit as claimed in claim 1, wherein said amplifying transistor is a field effect transistor.

6. A circuit as claimed in claim 1, wherein said diode is a Schottky-type switching diode.

7. An impedance matching circuit comprising:

an inductor cascaded to an output terminal of an amplifying transistor; and a diode connected in parallel with said inductor;

wherein said diode is rendered conductive at a voltage slightly lower than a peak voltage to appear between opposite ends of said inductor when an output terminal current of said amplifying transistor is saturated due to a signal having a great amplitude being input to an input circuit of the amplifying transistor; and wherein said inductor constitutes and arm of a $\pi$ matching circuit.

8. An impedance matching circuit comprising:

an inductor cascaded to an output terminal of an amplifying transistor; and a diode connected in parallel with said inductor;

wherein terminals of said diode are connected directly to terminals of said inductor; and wherein said diode is rendered conductive at a voltage slightly lower than a peak voltage between opposite ends of said inductor when an output terminal current of said amplifying transistor is saturated due to a high amplitude signal being input to an input circuit of said amplifying transistor.

* * * * *